US006255834B1

(12) United States Patent
Smith

(10) Patent No.: US 6,255,834 B1
(45) Date of Patent: Jul. 3, 2001

(54) TEST FIXTURE HAVING A FLOATING SELF-CENTERING CONNECTOR

(75) Inventor: Lonnie Wilhelm Smith, Round Rock, TX (US)

(73) Assignee: Dell USA, L.P., Round Rock, TX (US)

( * ) Notice: Subject to any disclaimer, the term of this patent is extended or adjusted under 35 U.S.C. 154(b) by 0 days.

(21) Appl. No.: 09/425,911

(22) Filed: Oct. 21, 1999

(51) Int. Cl.[7] .......................... G01R 31/02; G01R 31/26; G01R 31/04
(52) U.S. Cl. .......................... 324/755; 324/761; 324/754; 324/758; 324/538
(58) Field of Search .................................. 324/755, 754, 324/758, 761, 538

(56) References Cited

U.S. PATENT DOCUMENTS

| | | | |
|---|---|---|---|
| 3,970,934 | * 7/1976 | Aksu | 324/754 |
| 4,357,575 | 11/1982 | Uren | 324/758 |
| 4,783,624 | 11/1988 | Sabin | 324/758 |
| 4,866,375 | 9/1989 | Malloy | 324/754 |
| 4,906,920 | 3/1990 | Huff | 324/754 |
| 4,985,107 | 1/1991 | Conroy | 156/299 |
| 5,055,055 | 10/1991 | Bakker | 439/78 |
| 5,092,774 | 3/1992 | Milan | 439/66 |
| 5,136,237 | 8/1992 | Smith | 324/149 |
| 5,148,103 | * 9/1992 | Pasiecznik, Jr. | 324/758 |
| 5,159,265 | 10/1992 | Alfonso | 324/761 |
| 5,204,615 | 4/1993 | Richards | 324/757 |
| 5,273,463 | 12/1993 | Kaetsu | 439/681 |
| 5,339,027 | * 8/1994 | Woith et al. | 324/754 |
| 5,374,204 | 12/1994 | Foley | 439/751 |
| 5,436,568 | 7/1995 | Woith | 324/758 |
| 5,447,442 | 9/1995 | Swart | 439/77 |
| 5,461,326 | * 10/1995 | Woith et al. | 324/758 |
| 5,485,096 | 1/1996 | Aksu | 324/761 |
| 5,534,787 | * 7/1996 | Levy | 324/761 |
| 5,633,597 | 5/1997 | Stowers | 324/761 |
| 5,670,884 | 9/1997 | Kodama | 324/538 |
| 5,698,990 | 12/1997 | Aussant | 324/761 |
| 5,701,079 | 12/1997 | Yagi | 324/538 |
| 5,831,438 | 11/1998 | Okura | 324/538 |
| 5,923,180 | 7/1999 | Botka | 324/758 |

* cited by examiner

Primary Examiner—Glenn W. Brown
Assistant Examiner—Wasseem H. Hamdan
(74) Attorney, Agent, or Firm—Haynes and Boone, L.L.P.

(57) ABSTRACT

A test fixture including a fixture body and a self-centering or floating connector body positioned adjacent to a first side of the fixture body. The connector body is made of a polymeric material. Spaced apart sleeves extending through the fixture body. A first end of each one of the sleeves includes a threaded portion engaged with a corresponding threaded portion in the connector body. Each one of the sleeves defines a respective longitudinal axis. A head is attached to a second end of each one of the sleeves. Each head includes a tapered portion engaging a tapered seat provided on a second side of the fixture body. An alignment pin extends axially through each one of the sleeves along the respective longitudinal axis. Each pin includes a shaft, a flange attached to the shaft and an end protruding from the connector body. A first spring member is axially carried by each pin. Each first spring is compressed between the flange of the respective pin and the fixture body. A second spring member is axially is carried by each one of the sleeves. Each second spring is compressed between the fixture body and the connector body. The connector body exhibits a floating action during engagement with a connector of a device being tested. The connector body is also self-centering such that it accurately and reliably returns to a nominal position when disengaged from the device being tested.

15 Claims, 3 Drawing Sheets

TEST FIXTURE HAVING A FLOATING SELF-CENTERING CONNECTOR

BACKGROUND

The disclosures herein relate generally to electronic test equipment and more particularly to a through connector circuit test apparatus.

Many electronic devices often include electronic assemblies such as printed circuit boards (PCB's) that have one or more electrical connectors. To ensure that the electronic assembly is properly assembled, a through connector test sequence may be used to verify the operation of the electronic assembly. In this type of test, a circuit test apparatus is attached to one or more connectors of the electronic assembly.

Due to manufacturing tolerances, the connectors are not always positioned at the same location. The inconsistent positioning of these connectors can adversely affect the ability to use an automated circuit test apparatus to test the device. To compensate for variations in positioning, certain circuit test apparatus is often designed to float and to be self-centering. The floating feature allows the connector to translate to accommodate slight misalignments between the test connector of the fixture and the connector of the assembly being tested. The self-centering feature ensures that the connector returns to a nominal position when the fixture is disengaged from the electronic device being tested.

U.S. Pat. No. 5,831,438 discloses a device for testing a connector which has a plurality of terminals, each one of the terminal being mounted in a respective terminal chamber. There is a flexing space adjacent to each chamber and a resilient tongue, biased into the chamber. The resilient tongue is moved into the space as the terminals are inserted and springs out of the space when they are fully within their respective chambers. The device has a plurality of testing units attached within a body which is movable toward and away from the connector. If at least one of the terminals is not fully inserted into its chamber, the body is moved backward away from the connector so that contact between the units and the terminals is not made.

U.S. Pat. No. 5,698,990 discloses a counterforce spring assembly for printed circuit board test fixtures. A number of counterforce spring assemblies are provided in an array between the top plate and probe plate of the test fixture. Each counterforce spring assembly includes a support cup residing in an aperture through the probe plate. A compression spring resides in the support cup and provides spring-biasing of the top plate to the probe plate during the testing cycle. Each counterforce spring assembly includes a circumferential flange to limit downward travel of the top plate toward the probe plate. Each assembly is small enough to fit between probe apertures corresponding to component leads of the device being tested. The counterforce spring assemblies can be freely placed underneath the top plate to provide even spring-biasing thereof to prevent bowing and bending of the top plate which often causes errors in the testing of printed circuit boards.

U.S. Pat. No. 5,461,326 discloses a test probe including a flexible membrane having an array of test probe contacts. The test probe is capable of softly and gently contacting pads on a device under test with a structure that effectively applies tension to the membrane while at the same time automatically leveling the membrane and removing distortions. A small pressure plate is bonded to the inner surface of the membrane behind the test probe contacts. A pressure post having a pointed or rounded end is pressed against the pressure plate and makes pivotal contact with the plate. A spring including an adjustment screw that axially adjusts the compression of the spring, applies pressure through the pivot point to the pressure plate and to the membrane at its test probe contacts. When the probe contacts are pressed against a device to be tested, the probe contacts and the pressure plate rotate about the pivot point of the pressure post. This action planarizes the test probe contact array and levels the test contact array while appropriately tensioning the membrane.

U.S. Pat. No. 5,159,265 discloses a pivotable spring probe that includes a housing having an opening including a plunger that is guided by the housing. The plunger is slidably movable between an extended position and a retracted position. A pivotable contact head is mounted on the plunger for making electrical contact with a conductive surface external to the housing. A spring is mounted on the bottom of the plunger for biasing the plunger toward the housing opening.

U.S. Pat. No. 4,357,575 discloses an improved testing fixture apparatus for use in accurately effecting temporary electrical connections with the test point zones of printed circuit boards or the like. The board to be tested is mounted upon a locator assembly that is shiftably receivable within the fixture. The fixture includes a centering and gripping mechanism operative in conjunction with a cooperative part carried by the contact bearing portion of the fixture. The centering and gripping mechanism automatically positions the locator assembly and printed circuit board in a predetermined location within the fixture. This positioning assures precise alignment of a contact with each of the test point zones of the printed circuit board to be tested. The positioning action of the mechanism and its cooperating part includes both a centering function and a gripping function therebetween. Both of the functions occur automatically in response to relative shifting of the portions of the fixture for respectively supporting the printed circuit board and the contacts toward each other into an operative relationship for affecting electrical connections between the test point zones of the printed circuit board and corresponding contacts of the fixture.

The floating and self-centering functionality of a test connector may degrade over time. After prolonged use, some conventional test connectors develop a positional bias which returns the connector to an offset, non-centered nominal position. As the test connector is not able to properly mate with the corresponding connector of the device being tested, the test apparatus of the device being tested is often damaged.

Accordingly, there is a need for a through connector circuit test apparatus that exhibits accurate and reliable floating and self-centering operation to overcome the shortcomings of previous test connectors.

SUMMARY

One embodiment, accordingly, provides a test apparatus that reliably mates with a corresponding connector of an electronic device to facilitate testing of the device. To this end, one embodiment provides an apparatus including a fixture body and a connector body positioned adjacent to a first side of the fixture body. A sleeve extends through the fixture body. A first end of the sleeve is attached to the connector body. A head is provided on a second end of the sleeve. The head includes a tapered portion that engages a tapered seat on a second side of the fixture body. A resilient member is engaged between the fixture body and the connector body.

A principal advantage of this embodiment is that the connector body accurately and reliable returns to it nominal position when disengaged from the device being tested.

BRIEF DESCRIPTION OF THE DRAWING FIGURES

DETAILED DESCRIPTION

Figure 1:
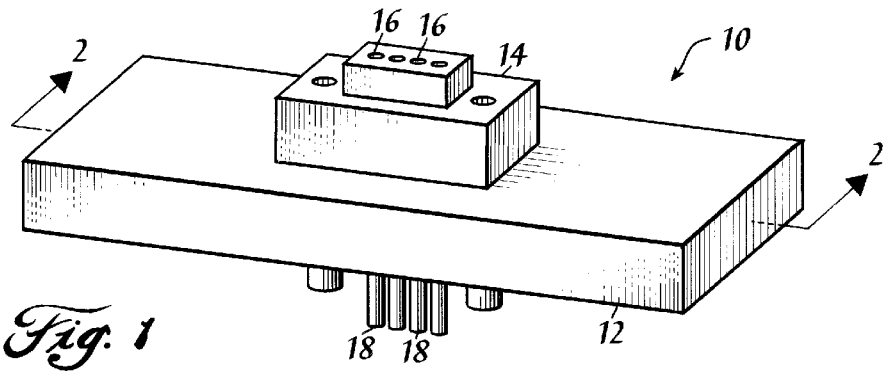
FIG. 1 is a perspective view illustrating an embodiment of a test apparatus according to the present disclosure.
Figure 2:
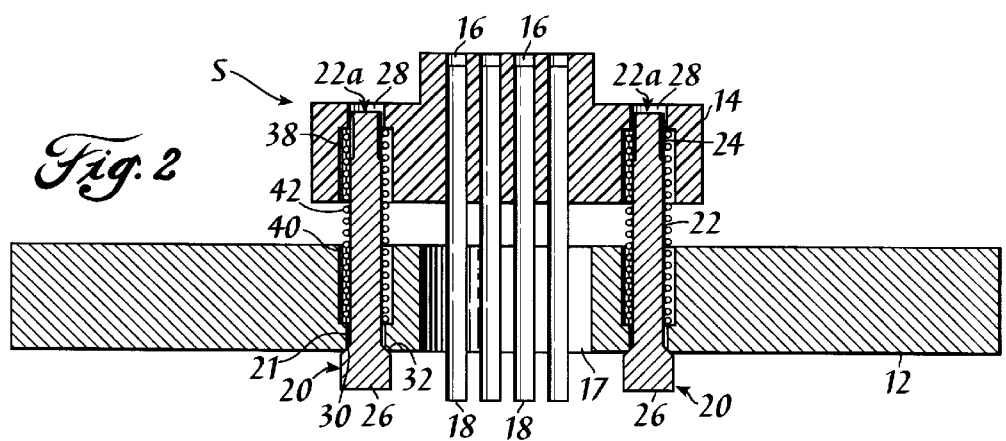
FIG. 2 is a cross sectional view taken along the line 2—2 in FIG. 1.
Figure 4:
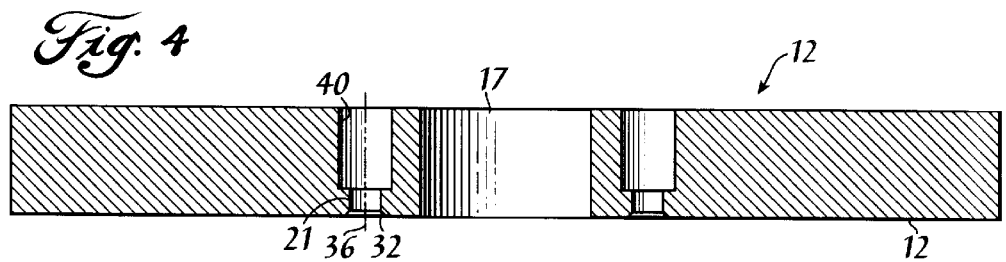
FIG. 4 is a cross sectional view illustrating an embodiment of a fixture body.

An embodiment of a test apparatus 10 for conducting through connector testing of a device such as a motherboard of a computer is illustrated in FIG. 1. The test apparatus 10 includes a fixture body 12 and a connector body 14 movably attached to the fixture body 12. A plurality of passages 16 are formed through the connector body 14 and a probe 18 is received in each one of the passages 16.

Now referring to FIGS. 2–5, the connector body 14 is attached to the fixture body 12 by two spaced apart sleeves 20. Each one of the two sleeves 20 includes a shaft portion 22 having a threaded portion 24 formed at a first end 22a of the shaft portion 20 and a head 26 attached to a second end 22b of the shaft portion 20. The first end 22a of the shaft portion 22 of each one of the sleeves 20 passes through a corresponding bore 21 in the fixture body 12. The threaded portion 24 of each one of the sleeves 20 is fastened in a corresponding threaded hole 28 formed in the connector body 14. The bore 21 has a diameter larger than a diameter of the shaft portion 22 of each one of the sleeves 20. The head 26 of each one of the sleeves 20 includes a tapered portion 30 that engages a corresponding tapered seat 32 formed in the fixture body 12.

Figure 5:
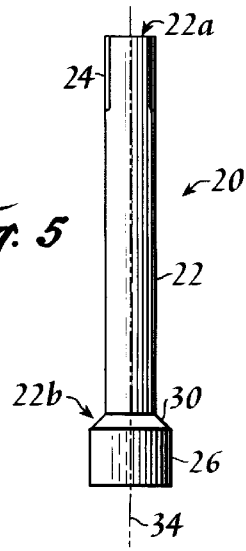
FIG. 5 is a side view illustrating an embodiment of a sleeve.

The tapered portion 30 of each one of the sleeves 20 defines a longitudinal axis 34, FIG. 5. Each tapered seat 32 defines a reference axis 36, FIG. 4. When the connector body 14 is in a static position S with respect to the fixture body 12, FIG. 2, the longitudinal axis 34 of each one of the sleeves 20 is substantially aligned with the reference axis 36 of the corresponding tapered seat 32.

Figure 3:
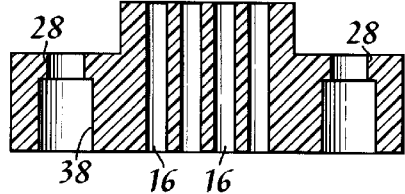
FIG. 3 is a cross sectional view illustrating an embodiment of a connector body.

The connector body 14 includes a cavity 38 adjacent to the threaded hole 28, FIG. 3. The fixture body 12 includes a cavity 40 adjacent to the bore 21, FIG. 4. Each sleeve 20 axially carries a resilient member 42 such as a helically wound spring. Each resilient member 42 is compressed between the connector body 14 and the fixture body 12 such that the connector body 14 is biased to the static position S, FIG. 2.

The fixture body 12 is made of a metal or polymeric material that exhibits a relatively high flexural strength such as aluminum or a fiber reinforced polyester. It is essential that probes 18 be mounted in the connector body 14 in a manner in which they are electrically isolated. To this end, the connector body 14 is made of a non-conductive material such as a non-conductive polymeric material or a non-conductive ceramic material.

Figure 6:
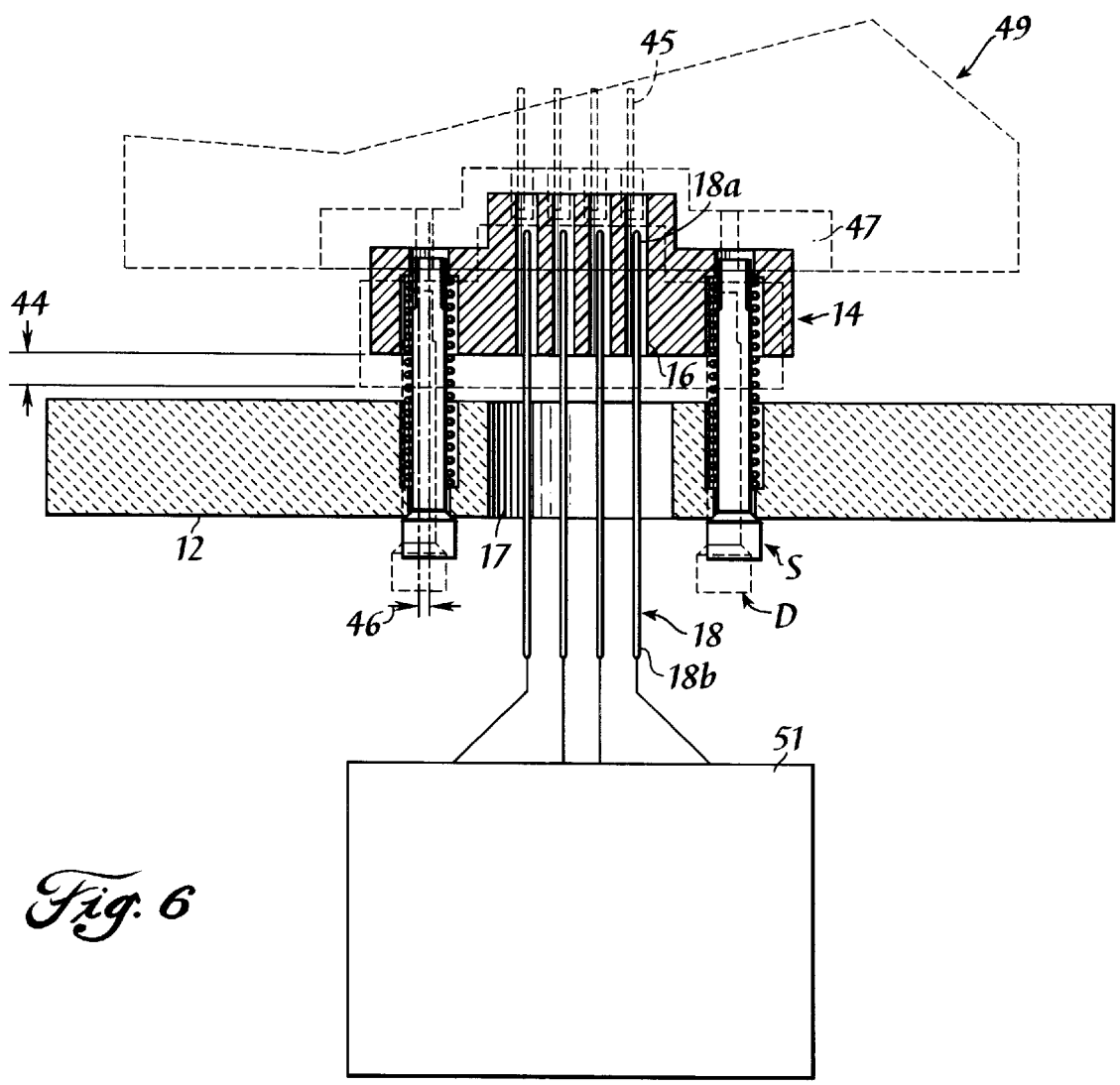
FIG. 6 is a diagrammatic view illustrating a displacement of the connector body with respect to the fixture body.

Referring now to FIG. 6, a first end 18a of each one of the probes 18 is mounted in a respective one of the passages 16 for engaging a contact pin 45 in a connector 47 of a device 49 being tested. A second end 18b of each probe 18 extends from the connector body 14 through an opening 17 in the fixture body 12. The probes 18 can be connected between the device 49 and a data acquisition device 51 for acquiring and analyzing various electrical data for the device 49. A typical aspect or performance that is analyzed during testing is whether all of the components of the device being tested have been successfully connected to other related components. For example, it is common to test a motherboard to ensure that various component connectors such as that for a microprocessor has been successfully connected to various input and output connects located at an edge of the motherboard.

Still referring to FIG. 6, the connector body 14 is movable between the static position S and a displaced position D. In the case of the connector body 14 being perfectly aligned with a connector 47 of the device 49, the engagement of the connector body 14 with the connector 47 of the device 49, will result in only an axial displacement 44 of the connector body 14 relative to the fixture body 12. However, in most instances, the connector body 14 is not perfectly aligned with the connector 47 of the device 49. As a result, the connector body 14 also experiences a radial displacement 46 relative to the fixture body 12 when the connector body 14 is engaged with the connector 47 of the device 49.

It is a key aspect of embodiments according to the present disclosure that the connector body 14 exhibits self-centering characteristics such that it repeatedly and accurately returns to a nominal position. In the past, self-centering functionality has been difficult to achieve over extended periods of use and when wires and/or a connector are attached to the probes 18. It is also a key aspect of embodiments of the present disclosure that the connector body 14 be able to float freely with respect to the fixture body 12.

Figure 7:
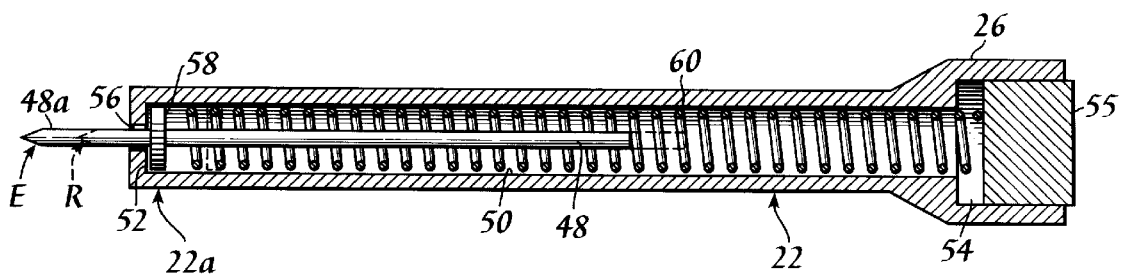
FIG. 7 is a cross sectional view illustrating an alternate embodiment of an alignment pin mounted in the sleeve.
Figure 8:
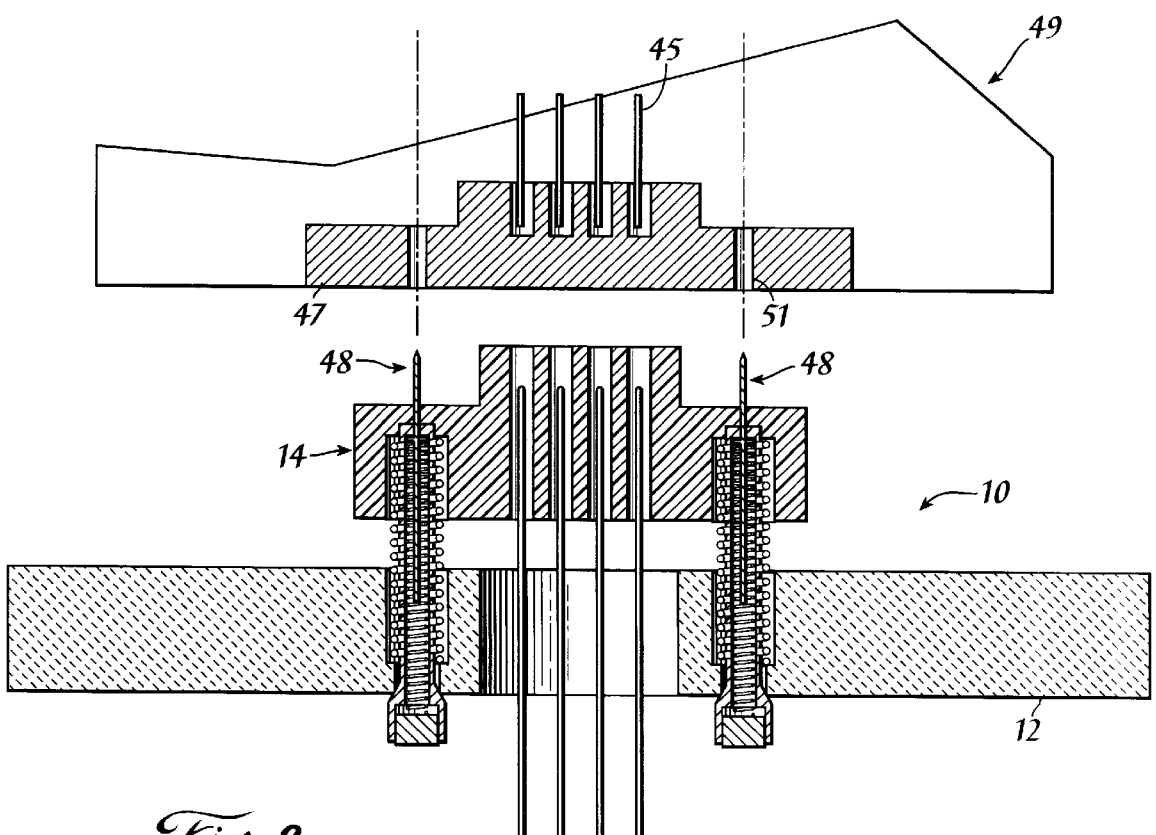
FIG. 8 is a cross sectional view illustrating two alignment pins attached to a test apparatus.

An alternate embodiment of a test apparatus 10 including a pair of spaced apart alignment pins 48 is illustrated in FIGS. 7 and 8. In some applications, the alignment pin 48 is used to locate the connector body 14 relative to a locating feature 51, FIG. 8, of the device 49. A common locating feature 51 is a screw hole in the connector 47 of the device 49. When the test apparatus 10 is moved towards the device 49, the alignment pins 48 engage respective locating features 51 to align with connector body 14 with respect to the connector 47of the device 49.

As illustrated in FIG. 7, the sleeve 20 includes a channel 50 having a shoulder 52 adjacent to the first end 22a and a counter-bored portion 54 in the head 26 of the sleeve 20. A plug 55 is fixedly mounted in the counter-bored portion 54 of the head 26 by a method such as a press fit, adhesive, threads, swagging or other known methods. A hole 56 is formed through the shoulder 52. The alignment pin 48 is positioned in the channel 50 with a tip portion 48a extending through the hole 56. The alignment pin includes a flange 58 within the channel 50. A resilient member 60 such as a helically wound spring is compressed between the flange 58 and the plug 55 for biasing the alignment pin 48 to an extended position E. The alignment pin 48 is movable between the extended position E and a retracted position R.

One embodiment provides an apparatus including a fixture body and a connector body positioned adjacent to a first side of the fixture body. A sleeve extends through the fixture body. A first end of the sleeve is attached to the connector body. A head is provided on a second end of the sleeve. The head includes a tapered portion that engages a tapered seat on a second side of the fixture body. A resilient member is engaged between the fixture body and the connector body.

Another embodiment provides a test fixture including a fixture body and a floating connector body positioned adjacent to a first side of the fixture body. The connector body is made of a polymeric material. A plurality of spaced apart sleeves extend through the fixture body. A first end of each one of the sleeves includes a threaded portion engaged with a corresponding threaded portion in the connector body. Each one of the sleeves defines a respective longitudinal axis. A head is provided on a second end of each one of the sleeves. Each head includes a tapered portion engaging a tapered seat on a second side of the fixture body. An alignment pin extends axially through each one of the sleeves along the respective longitudinal axis. Each pin includes a shaft, a flange attached to the shaft and an end protruding from the connector body. A first spring member is axially carried by each pin. Each first spring is compressed between the flange of the respective pin and the fixture body. A second spring member is axially carried by each one of the sleeves. Each second spring is compressed between the fixture body and the connector body.

A further embodiment provides a through connector test apparatus including a fixture body having a bore therethrough. The bore defines a reference axis. A self-centering connector body is movably attached to the fixture body. The connector body is movable between a static position and a displaced position with respect to the fixture body. A sleeve extends through the bore in the fixture body. A first end of the sleeve is attached to the connector body. The sleeve defines a longitudinal axis. The apparatus includes a structure for aligning the longitudinal axis of the sleeve to be substantially coincident with the reference axis when the connector body is in the static position. The structure includes a first portion attached to the sleeve and a second portion attached to the fixture body for being engaged by the first portion when the connector body is in the static position. A resilient member is engaged between the connector body and the fixture body for biasing the connector body toward the static position.

As it can be seen, the embodiments presented herein provide several advantages. The connector body consistently returns to it nominal position when disengaged from the device being tested. The tolerance associated with the nominal position of the connector body is greatly reduced and does not significantly increase over extended periods of time and operation. Tooling pins are not needed to accomplish precision alignment. The useful life of the test fixture is extended due to reduced binding between the connector body and the device being tested. The wires attached to the connector body do not adversely affect the floating or self-centering functionality of the connector body. The longevity of the floating and self-centering functionality of the test apparatus is enhanced.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. An apparatus, comprising:
   a fixture body;
   a connector body positioned adjacent to a first side of the fixture body;
   a sleeve defining a longitudinal axis, the sleeve extending through the fixture body, a first end of the sleeve attached to the connector body;
   a head on a second end of the sleeve, the head including a tapered portion engaging a tapered seat on a second side of the fixture body;
   a resilient member engaged between the fixture body and the connector body;
   the connector body being movable between a static position and a displaced position in a direction generally parallel to the longitudinal axis;
   the connector body being movable in a radial direction with respect to the longitudinal axis of the sleeve when the sleeve is moved toward the displaced position; and
   the connector body being offset from the fixture body by an offset distance when the connector body is in the static position.

2. The apparatus of claim 1 wherein the tapered portion of the head and the tapered seat have mating conical surfaces.

3. The apparatus of claim 1 further comprising a plurality of probes extending through the connector body.

4. The apparatus of claim 1 wherein the connector body is made of a non-conductive polymeric material.

5. The apparatus of claim 1 further comprising an alignment pin extending axially through the sleeve along a longitudinal axis of the sleeve, the pin including a shaft, a flange attached to the shaft and an end protruding from the connector body opposite the fixture body.

6. The apparatus of claim 5 further comprising a helically wound spring compressed between the flange of the alignment pin and the head of the sleeve.

7. The apparatus of claim 1 wherein the first end of the sleeve includes a threaded portion engaged with a corresponding threaded portion in the connector body.

8. The apparatus of claim 1 wherein the resilient member is a helically wound spring.

9. The apparatus of claim 1 wherein a first portion of the resilient member is received in a cavity formed in the connector body and a second portion of the resilient member is received in a cavity formed in the fixture body.

10. A test fixture, comprising:
    a fixture body;
    a floating connector body positioned adjacent to a first side of the fixture body;
    a plurality of spaced apart sleeves extending through the fixture body, a first end of each one of the sleeves including a threaded portion engaged with a corresponding threaded portion in the connector body;
    a head on a second end of each one of the sleeves, each head including a tapered portion engaging a tapered seat on a second side of the fixture body, the tapered portion of each one of the sleeves defining a respective longitudinal axis;
    an alignment pin extending axially through each one of the sleeves along the respective longitudinal axis, each pin including a shaft, a flange attached to the shaft and an end protruding from the connector body opposite the fixture body;
    a first spring member axially carried by each pin, each first spring being compressed between the flange of the respective pin and the head of the respective one of the sleeves;

a second spring member axially carried by each one of the sleeves, each second spring being compressed between the fixture body and the connector body;

the longitudinal axis of each one of the sleeves extending in a direction generally parallel to a reference axis, the reference axis extending generally perpendicular to the first side of the fixture body;

the connector body being movable between a static position and a displaced position in a direction generally parallel to the reference axis;

the connector body being movable in a radial direction with respect to the reference axis when the connector body is moved toward the displaced position; and the connector being offset from the fixture body by an offset distance when the connector body is in the static position.

11. The test fixture of claim 10 wherein the tapered portion of the head and the tapered seat have mating conical surfaces.

12. The test fixture of claim 10 further comprising a plurality of probes extending through the connector body.

13. A through connector test apparatus, comprising:

a fixture body including a bore therethrough, the bore defining a reference axis;

a self-centering connector body movably attached to the fixture body, the connector body being movable between a static position and a displaced position with respect to the fixture body;

a sleeve extending through the bore in the fixture body, a first end of the sleeve attached to the connector body, the sleeve defining a longitudinal axis;

means for aligning the longitudinal axis of the sleeve to be substantially coincident with the reference axis when the connector body is in the static position, the means for aligning including a first portion attached to the sleeve and a second portion attached to the fixture body for being engaged by the first portion when the connector body is in the static position;

a resilient member engaged between the connector body and the fixture body for biasing the connector body toward the static position; and the connector body being offset from the fixture body by an offset distance when the connector body is in the static position.

14. The apparatus of claim 13 wherein the connector body is movable in a radial direction with respect to the reference axis when the connector body is moved toward the displaced position.

15. The apparatus of claim 13 further comprising a plurality of probes extending through the connector body.

* * * * *